(12) United States Patent
Ha et al.

(10) Patent No.: US 9,710,327 B2
(45) Date of Patent: Jul. 18, 2017

(54) FLASH MEMORY SYSTEM AND OPERATING METHOD THEREOF

(71) Applicants: SK hynix Inc., Gyeonggi-do (KR); Korea Advanced Institute of Science and Technology, Daejeon (KR)

(72) Inventors: Jeong-Seok Ha, Daejeon (KR); Dae-Sung Kim, Daejeon (KR); Su-Hwang Jeong, Daejeon (KR)

(73) Assignees: SK Hynix Inc., Gyeonggi-do (KR); Korea Advanced Institute of Science and Technology, Daejeon (KR)

( * ) Notice: Subject to any disclaimer, the term of this patent is extended or adjusted under 35 U.S.C. 154(b) by 115 days.

(21) Appl. No.: 14/802,833

(22) Filed: Jul. 17, 2015

(65) Prior Publication Data

US 2016/0210190 A1 Jul. 21, 2016

(30) Foreign Application Priority Data

Jan. 21, 2015 (KR) ........................ 10-2015-0009859

(51) Int. Cl.

| H03M 13/00 | (2006.01) |
| G06F 11/10 | (2006.01) |
| H03M 13/29 | (2006.01) |
| H03M 13/15 | (2006.01) |
| G11C 11/56 | (2006.01) |
| G11C 16/34 | (2006.01) |
| G11C 29/52 | (2006.01) |
| G11C 29/42 | (2006.01) |

(52) U.S. Cl.
CPC ...... *G06F 11/1068* (2013.01); *G11C 11/5642* (2013.01); *G11C 16/3418* (2013.01); *H03M 13/152* (2013.01); *H03M 13/2927* (2013.01); *G11C 29/42* (2013.01); *G11C 29/52* (2013.01)

(58) Field of Classification Search
None
See application file for complete search history.

(56) References Cited

U.S. PATENT DOCUMENTS

| 7,966,546 | B2 | 6/2011 | Mokhlesi et al. | |
| 7,966,550 | B2 | 6/2011 | Mokhlesi et al. | |
| 8,074,151 | B1 | 12/2011 | Burd et al. | |
| 8,145,981 | B2 | 3/2012 | Mokhlesi et al. | |
| 8,335,977 | B2 | 12/2012 | Weingarten et al. | |
| 8,621,318 | B1 * | 12/2013 | Micheloni ........... | G06F 11/1012 714/755 |
| 8,627,188 | B2 | 1/2014 | Weingarten et al. | |

(Continued)

*Primary Examiner* — Daniel McMahon
(74) *Attorney, Agent, or Firm* — IP & T GROUP LLP (57) ABSTRACT

An operation method of a flash memory system includes a hard decision decoding on a codeword and a soft decision decoding on an error message block. The hard decision decoding on a codeword and the codeword comprises message blocks encoded with row constituent codes and column constituent codes according to a block-wise concatenated BCH (BC-BCH) method. When the hard decision decoding fails, the error message block to which the hard decision decoding fails among a plurality of the message blocks is identified. Soft decision information corresponding to the row constituent codes and the column constituent codes of the error message block is generated and the soft decision decoding on the error message block based on the soft decision information is performed.

18 Claims, 8 Drawing Sheets

(56) References Cited

U.S. PATENT DOCUMENTS

| | | | |
|---|---|---|---|
| 9,128,858 B1* | 9/2015 | Micheloni | G06F 11/10 |
| 2013/0132793 A1* | 5/2013 | Ha | H03M 13/2912 |
| | | | 714/755 |
| 2013/0132804 A1* | 5/2013 | Frayer | G06F 11/1012 |
| | | | 714/780 |
| 2015/0039964 A1* | 2/2015 | Fonseka | H04L 1/0041 |
| | | | 714/756 |

\* cited by examiner

Parallel Concatenation

FIG. 4B

Serial Concatenation

FIG. 5

Parallel Concatenation

FLASH MEMORY SYSTEM AND OPERATING METHOD THEREOF

CROSS-REFERENCE TO RELATED APPLICATIONS

The present application claims priority of Korean Patent Application No. 10-2015-0009859, filed on Jan. 21, 2015, which is incorporated herein by reference in its entirety.

BACKGROUND

1. Field

Various embodiments of the present invention relate to a flash memory system and, more particularly, to a flash memory system performing error correction with a concatenated Bose-Chadhuri-Hocquenghem (concatenated BCH) code and an operation method thereof.

2. Description of the Related Art

With the Increase in speed of processors and main storage devices, such as RAM, a bottleneck has occurred in various electronic devices. The bottleneck is due to processors and main storage devices being limited by the operating speed of the auxiliary storage devices. Devices that store data using a magnetic field, such as hard disk drives (HDDs), and optic disc drives (ODDs), such as CDs and DVDs, have generally been used for auxiliary storage devices. The speed at which optical disc devices may operate is limited, and often slow relative to processor and main memory speeds. Devices that store data using magnetic fields generally operate at higher speeds than optical disc devices, but still cause bottlenecking, and are prone to damage from physical impacts. Accordingly, solid-state drives (SSDs) formed using semiconductor elements may be a solution to alleviate the bottlenecking problem. SSDs have processing speeds higher than HDDs, and may input and output data at high speed without requiring time to search for data that needs to be randomly accessed. In addition, since SSDs have no moving parts, there are no mechanical delays or mechanical failures and the likelihood of damage from physical impact is significantly reduced. Further, SSDs are energy efficient, do not generate a lot of heat, and are quiet. Additionally, SSDs have a small form factor and relative to HDDs, making them ideal for portable electronic devices.

In SSDs, generally NOR flash memory or NAND flash memory is used. NAND flash memory is capable of being highly integrated and has serial connections, making it suitable for high capacity memory devices, and has high read/writing speeds. Therefore, NAND flash memory is used for most mass capacity SSD.

However, the NAND flash memory element is constantly undergoing miniaturization and it is increasingly being required to store multiple bits of Information per memory cell. The increased storage density results in adverse effects such as deteriorated reliability and decreased life.

Figure 1:
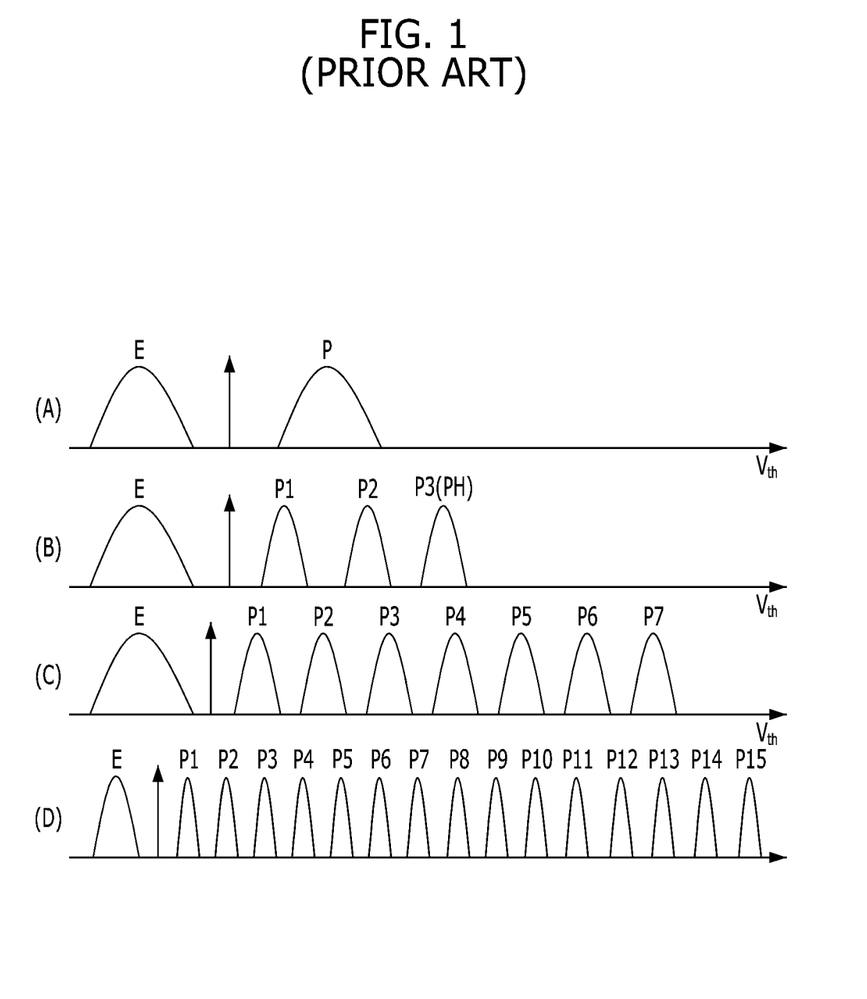
FIG. 1 is a diagram illustrating distributions of threshold voltages according to a number of bits stored in a flash memory cell.

Referring to FIG. 1, the likelihood of errors caused by inter-level interference increases during reading operations when there is an increase in the number of bits stored per cell, and the error occurrence drastically increases as reading/writing operations are repeated, resulting in decreased reliability of the product overall. Therefore, an error correction circuit that is both energy efficient and has high processing power is an essential element in designing stable NAND flash memories at reasonable prices.

To resolve such concerns, error correction encoding is generally used. Error correction encoding requires extra bits of data storage to store information for error detection and correction. This requires chip area for extra memory cells to store the extra bits. However, to maximize the storage capacity of the storage medium, the area used to store the extra bits is miniaturized, and the amount extra bits required needs to be minimized as well.

In addition, due to the increase of data storage errors, advanced error correction encoding has been substituted for conventional BCH encoding and Reed-Solomon (RS) encoding. This advanced error correction encoding requires exponentially greater complexity and greater data storage.

A low density parity check (LDPC) code that is proven to have good performance in the field of telecommunication may be one of the candidates. However, the LDPC code is not widely commercialized due to the complexity of the decoder, since the information that a flash memory provides to an error correction decoder is mainly hard decision information.

Therefore, to improve the performance of the LDPC code, information similar to soft decision information needs to be generated by raising a quantization level of the hard decision information, for example, by re-reading a page where errors occur with changed threshold voltage for the page.

A block-wise concatenated BCH (BC-BCH) code has excellent error correction performance with hard decision information, and the BC-BCH code decoder is less complex and more easily implemented than conventional BCH code decoders.

The conventional BC-BCH code decoding techniques may include iteratively decoding a row BCH constituent code and a column BCH constituent code in an alternate way when only the hard decision information is given, and lowering an error floor through reconstruction of information by utilizing the chase decoding for the decoding-failed BCH constituent code when the soft decision information is given. That is, the soft decoding technique where the row BCH constituent code and the column BCH constituent code cooperate with each other in decoding when using the soft decision information, which improves the error floor characteristics and the overall decoding performance, is not proposed. Also, unlike the conventional product code, a result of the hard decision decoding may be used for the soft decision decoding. However, the BC-BCH code decoding techniques utilizing the result of the hard decision decoding for the soft decision decoding have not been implemented.

When the hard decision decoding fails, the BC-BCH code has information for decoding-failed BCH constituent codes, which causes the failure of the hard decision decoding. Therefore, the BC-BCH code has an advantage of locating the decoding-failed BCH constituent codes when the hard decision decoding fails.

Accordingly, the conventional arts may effectively lower the error floor of the BC-BCH by re-reading information having the error from the memory cell (read and retry) and performing the chase decoding. However, according to the conventional arts, the soft decision information is used only for lowering the error floor while the performance of the BC-BCH code may not be improved.

SUMMARY

Various embodiments of the present invention are directed to an error correction method for a flash memory system using encoding and decoding with the block-wise concatenated BCH (BC-BCH) code.

In accordance with an embodiment of the present invention, an operation method of a flash memory system having a controller and a memory device, the operation method comprising: performing hard decision decoding on a codeword, which is encoded in units of message blocks with row constituent codes and column constituent codes according to a block-wise concatenated BCH (BC-BCH) method; identifying a location of an error message block to which the hard decision decoding fails among a plurality of the message blocks, when the hard decision decoding fails; generating soft decision information corresponding to the row constituent codes and the column constituent codes of the error message block; and performing soft decision decoding on the error message block based on the soft decision information.

The soft decision decoding may include a turbo BC-BCH code. The soft decision information may be generated using a reference voltage for the error message block. The performing of the soft decision decoding may comprise: generating second extrinsic information by decoding the soft decision information and first extrinsic information corresponding to the row constituent codes of the error message block; and generating third extrinsic information by decoding the soft decision information corresponding to the column constituent codes and the second extrinsic information. The first extrinsic information may include initial extrinsic information and a default value. The generating of the second extrinsic information may comprise: arranging a plurality of bits, which are obtained through a sum of the soft decision information corresponding to the row constituent code of the error message block and the first extrinsic information, in ascending order; obtaining a test pattern by selecting bits having lower reliability; obtaining a candidate codeword group by performing an XOR operation on the test pattern and the bits having lower reliability; determining a first codeword using the candidate codeword group and the soft decision information; obtaining a competition codeword group, which does not correspond to the first codeword among the candidate codeword group; determining a second codeword using the competition codeword group and the soft decision information; and obtaining the second extrinsic information through the first codeword and the second codeword. The test pattern is obtained by selecting bits having lower reliability and performing chase decoding. In determining of the first codeword, Euclidean distances may be obtained using the candidate codeword and the soft decision information and the smallest one of the Euclidean distances is selected. In the determining of the second codeword, Euclidean distances may be obtained using the competition codeword and the soft decision information and the smallest one of the Euclidean distances is selected. In the obtaining of the second extrinsic information, the second extrinsic information may be obtained using Equation 1.

$$Wi = \frac{|R-C|^2 - |R-D|^2}{4} \quad \text{[Equation 1]}$$

wherein 'Wi' may represent the second extrinsic information, 'R' represents the soft decision information for the row constituent codes of the error message block, 'C' represents the competition codeword, and 'D' represents the candidate codeword.

The generating of the third extrinsic information may comprise: arranging a plurality of bits, which are obtained through a sum of the soft decision information corresponding to the column constituent code of the error message block and the second extrinsic information, in ascending order; obtaining a test pattern by selecting bits having lower reliability; obtaining a candidate codeword group by performing an XOR operation on the test pattern and the bits having lower reliability; determining a first codeword using the candidate codeword group and the soft decision information; obtaining a competition codeword group, which does not correspond to the first codeword among the candidate codeword group; determining a second codeword using the competition codeword group and the soft decision information; and obtaining the third extrinsic information through the first codeword and the second codeword. The test pattern may be obtained by selecting bits having lower reliability and performing chase decoding. In the determining of the first codeword, Euclidean distances may be obtained using the candidate codeword and the soft decision information and the smallest one of the Euclidean distances is selected. In the determining of the second codeword, Euclidean distances may be obtained using the competition codeword and the soft decision information and the smallest one of the Euclidean distances is selected. In the obtaining of the third extrinsic information, the third extrinsic information may be obtained using Equation 2.

$$Wi = \frac{|R-C|^2 - |R-D|^2}{4} \quad \text{[Equation 2]}$$

wherein 'Wi' may represent the third extrinsic information, 'R' represents the soft decision information for the column constituent codes of the error message block, 'C' represents the competition codeword, and 'D' represents the candidate codeword.

In accordance with an embodiment of the present invention, a flash memory system may include a controller and a memory device. The controller may include: a first means for performing hard decision decoding on a codeword, which is encoded in units of message blocks with row constituent codes and column constituent codes according to a block-wise concatenated BCH (BC-BCH) method; a second means for identifying a location of an error message block on which the hard decision decoding falls; a third means for generating soft decision information corresponding to the row constituent codes and the column constituent codes of the error message block; and a fourth means for performing soft decision decoding on the error message block based on the soft decision information.

The soft decision decoding may include a turbo BC-BCH code. The fourth means may comprise: a fifth means for generating second extrinsic information by decoding the soft decision information and first extrinsic information corresponding to the row constituent codes of the error message block; and a sixth means for generating third extrinsic information by decoding the soft decision information corresponding to the column constituent codes and the second extrinsic information. The fifth step may comprise: a seventh means for arranging a plurality of bits, which are obtained through a sum of the soft decision information corresponding to the row constituent code of the error message block and the first extrinsic information, in ascending order; an eighth means for obtaining a test pattern by selecting bits having lower reliability; a ninth means for obtaining a candidate codeword group by performing an XOR operation on the test pattern and the bits having lower reliability; a tenth means for determining a first codeword using the candidate codeword group and the soft decision information; an eleventh means for obtaining a competition codeword group that does not correspond to the first codeword among the candidate codeword group; a twelfth means for determining a second codeword using the competition codeword group and the soft decision information; and a thirteenth means for obtaining the second extrinsic information through the first codeword and the second codeword. The sixth step may comprise: a fourteenth means for arranging a plurality of bits, which are obtained through a sum of the soft decision information corresponding to the column constituent code of the error message block and the second extrinsic information, in ascending order; a fifteenth means for obtaining a test pattern by selecting bits having lower reliability; a sixteenth means for obtaining a candidate codeword group by performing an XOR operation on the test pattern and the bits having lower reliability; a seventeenth means for determining a first codeword using the candidate codeword group and the soft decision information; an eighteenth means for obtaining a competition codeword group that does not correspond to the first codeword; a nineteenth means for determining a second codeword using the competition codeword group and the soft decision information; and a twentieth means for obtaining the third extrinsic information through the first codeword and the second codeword.

In accordance with an embodiment of the present invention, when the hard decision decoding for a plurality of message blocks of the BC-BCH code fails, the soft decision decoding through block turbo decoding is performed only for error blocks and thus the performance of the BC-BCH code may be improved.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. The drawings are not necessarily to scale and, in some instances, proportions may have been exaggerated to clearly illustrate features of the embodiments. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence. In general, a flash memory device has dies coupled to one another in parallel, and the die has a plurality of memory blocks each of which is a unit of the erase operation. Each memory block has a plurality of pages, which is a unit of the program/read operations. Therefore, the error correction operation is performed per single page. The size of a single page is 1 KB for single level cells and 4 KB or 8 KB for multi-level cells, generally.

Flash memory devices as a storage device need high reliability, and thus should operate with very low error rates when working with an error correction code. Also, flash memory devices require limited delay times and complexity of encoders and decoders therein, for fast program and read speeds. Additionally, the flash memory devices have a limited ratio of parity bits to the stored data due to limited storage space for extra data, other than the user data, for storage efficiency. Therefore, as well as high coding rates, for example over 0.9, the error correction code for the flash memory devices should have no error floor or the lowest error floor that may be solved with a short delay time and low complexity.

The block-wise concatenated BCH (BC-BCH) code that may be applied to an embodiment of the present invention may include a block as a unit. When the BC-BCH code does not include the block but a bit as a unit for better error correction performance than the conventional BCH code, the BC-BCH code may include a plurality of short length BCH constituent codes.

The short length BCH constituent code has very low error correction performance that may correct 1 or 2 bits due to the high coding rate required for the flash memory device. Therefore, when a flash memory device is only capable of performing hard decision decoding, error correction failure may rarely occur in the short length BCH constituent code of the BC-BCH code including the bit as a unit, and thus the BC-BCH code including the bit as a unit may have lower error correction performance. In this case, the BC-BCH code including the bit as a unit may have improved error correction performance when using additional information. However, there may be longer delay times and higher complexity of the decoding because additional information is required for every decoding process. The BC-BCH code that may be applied to an embodiment of the present invention is suitable for a flash memory device. The BC-BCH code may include a small number of long length BCH constituent codes. The long length BCH constituent code has error correction performance for the high coding rate required for flash memory devices. For example, the BC-BCH code may include a long length BCH constituent code capable of correcting 10-bit and 14-bit errors. Therefore, when a flash memory device is only capable of performing hard decision decoding, error correction may rarely occur in the long length BCH constituent code of the BC-BCH code, and thus the BC-BCH code including the long length BCH constituent code may have higher error correction performance than the BC-BCH code including the bit as a unit.

The BC-BCH code may fail in decoding by an error block because the BC-BCH code includes the block as a unit. For example, there may be an error floor due to the lower bound. The error floor may occur due to a small number of error blocks.

Hereinafter, embodiments of the present invention will be described with reference to accompanying drawings.

Figure 2:
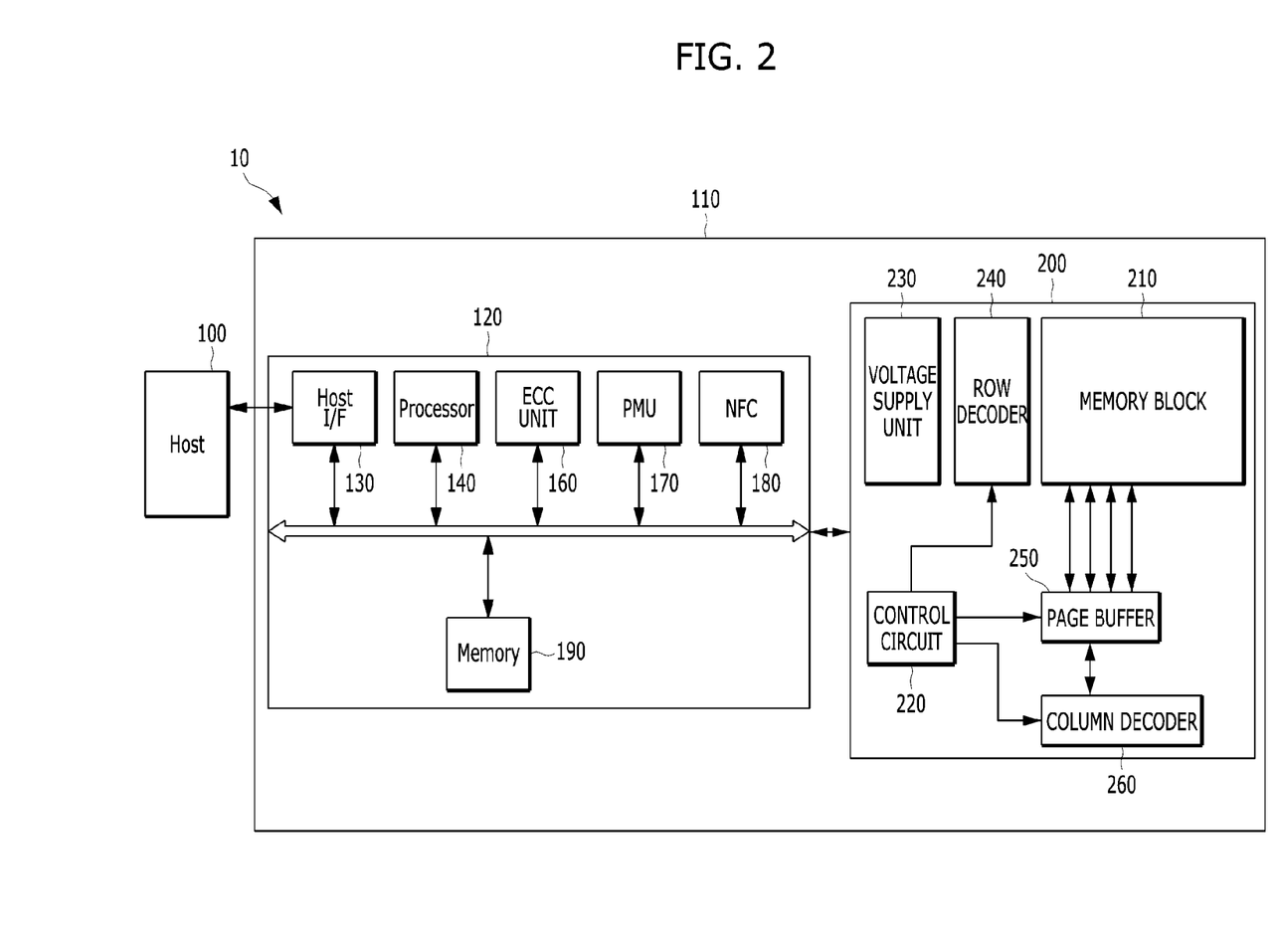
FIG. 2 is a block diagram illustrating a data processing system in accordance with an embodiment of the present invention.

FIG. 2 is a block diagram illustrating a data processing system 10 in accordance with an embodiment of the present invention.

Referring to FIG. 2, the data processing system 10 may include a host 100 and a memory system 110.

For example, the host 100 may include a portable electronic device such as a mobile phone, an MP3 player, a laptop computer, and so forth, and an electronic device such as a desktop computer, a game player, a TV, a projector, and so forth.

The memory system 110 may operate in response to a request of the host 100, and may store data to be accessed by the host 100. That is, the memory system 110 may serve as a main storage device or an auxiliary storage device. The memory system 110 may be implemented with one of various storage devices according to a host interface protocol coupled to the host 100. For example, the memory system 110 may be implemented with one of the various storage devices such as a solid-state drive (SSD), a multimedia card (MMC), an embedded MMC (eMMC), a reduced-size MMC (RS-MMC), and a micro-size version of MMC (MMCmicro), a secure digital (SD) card, a mini secure digital (miniSD) card, a micro secure digital (microSD) card, an universal storage bus (USB) storage device, a universal flash storage (UFS) device, compact flash (CF) card, a smart media (SM) card, a memory stick, and so forth.

A memory system 110 may include a semiconductor memory device 200 for storing data to be accessed by the host 100, and a memory controller 120 for controlling data storage to the semiconductor memory device 200. The semiconductor memory device 200 may be implemented with a volatile memory device such as a dynamic random access memory (DRAM) and a static RAM (SRAM), and a nonvolatile memory device such as a read only memory (ROM), a mask ROM (MROM), a programmable ROM (PROM), an erasable and programmable ROM (EPROM), an electrically erasable and programmable ROM (EEPROM), a ferroelectric ROM (FRAM), a phase change RAM (PRAM), a magnetic RAM (MRAM), a resistive RAM (RRAM) and a flash memory.

The memory controller 120 and the semiconductor memory device 200 may be integrated as a single semiconductor device. For example, the memory controller 120 and the semiconductor memory device 200 may be integrated as a single semiconductor device to form an SSD. The SSD may include a storage device for storing data in a semiconductor memory. When the memory system 110 is used as the SSD, operation speed of the host 100 coupled to the memory system 110 may be improved.

The memory controller 120 and the semiconductor memory device 200 may be integrated as a single semiconductor device to configure a memory card. For example, the memory controller 120 and the semiconductor memory device 200 may be integrated as a single semiconductor device to form a memory card such as a PC card of personal computer memory card international association (PCM-CIA), a compact flash (CF) card, a smart media (SM) card, a memory stick, a multimedia card (MMC), a reduced-size multimedia card (RS-MMC), and a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 110 may be provided as one of various elements forming an electronic device, such as a computer, an ultra-mobile PC (UMPC), a workstation, a net-book computer, a personal digital assistants (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices for a home network, one of electronic devices for a computer network, one of electronic devices for a telematics network, a radio-frequency identification (RFID) device, or elements of devices for a computing system.

The semiconductor memory device 200 may retain stored data even when power is blocked. The semiconductor memory device 200 may store data provided from the host 100 through the write operation, and may provide stored data to the host 100 through the read operation.

The semiconductor memory device 200 may include a memory block 210, a control circuit 220, a voltage supply unit 230, a row decoder 240, a page buffer 250, and a column decoder 260. The semiconductor memory device 200 may be the nonvolatile memory device, for example the flash memory device. The semiconductor memory device 200 may have a 3-dimensional stacked structure.

The memory block 210 may include a plurality of pages, each of which includes a plurality of memory cells coupled to a plurality of word lines.

The control circuit 220 may control various operations related to program, erase, and read operations of the semiconductor memory device 200.

The voltage supply unit 230 may provide word lines voltages, for example, a program voltage, a read voltage, and a pass voltage, to the respective word lines according to an operation mode, and may provide a voltage to be supplied to a bulk, for example, a well region, in which the memory cells are formed. A voltage generating operation of the voltage supply circuit 230 may be performed under control of the control logic 220. The voltage supply unit 230 may generate a plurality of variable read voltages for generation of a plurality of read data.

The row decoder 240 may select one of the memory blocks or sectors of the memory cell array 210, and may select one among the word lines of the selected memory block under the control of the control logic 220. The row decoder 240 may provide the word line voltage generated from the voltage supply circuit 230 to selected word lines or non-selected word lines under the control of the control logic 220.

During the program operation, the page buffer 250 may operate as a write driver for driving the bit lines according to data to be stored in the memory block 210. During the program operation, the page buffer 250 may receive the data to be written in the memory block 210 from a buffer (not illustrated), and may drive the bit lines according to the input data. The page buffer 250 may be formed of a plurality of page buffers (PB) 251 corresponding to the columns (or the bit lines) or column pairs (or bit line pairs), respectively. A plurality of latches may be included in each of the plural page buffers 251.

The memory controller 120 of the memory system 110 may control the semiconductor memory device 200 in response to a request from the host 100. For example, the memory controller 120 may provide data read from the semiconductor memory device 200 to the host 100, and may store data from the host 100 into the semiconductor memory device 200. To this end, the memory controller 120 may control the read, write, program and erase operations of the semiconductor memory device 200.

The memory controller 120 may include a host interface unit 130, a processor 140, an error correction code (ECC) unit 160, a power management unit (PMU) 170, a NAND flash controller (NFC) 180, and a memory 190.

The host interface 140 may process a command and data from the host 100 and may communicate with a host through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The ECC unit 160 may detect and correct an error included in data read from the memory block 210 during the read operation. The ECC unit 160 may perform the ECC decoding on the data read from the memory block 210, determine whether the ECC decoding succeeds, output an instruction signal according to the determination result, and correct error bits of the read data using parity bits generated during the ECC encoding. When a number of error bits included in the read data is beyond the error-correction capability of the ECC unit 160, the ECC unit may not correct the error bits, and thus may output an error correction fail signal.

The ECC unit 160 may correct an error through a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), A block coded modulation (BCM), and so on. The ECC unit 160 may include an error correction circuit, an error correction system, and an error correction device.

The PMU 170 may provide and manage power to the memory controller 120.

The NFC 180 may serve as an interface between the memory controller 120 and the semiconductor memory device 200 for the memory controller 120 to control the semiconductor memory device 200 in response to the host 100. When the semiconductor memory device 200 is the flash memory device, for example, a NAND flash memory device, the NFC 180 may generate a control signal of the semiconductor memory device 200 and process data under the control of the processor 140.

The memory 190, as an operational memory for the memory system 110 and the memory controller 120, may store data for driving the memory system 110 and the memory controller 120. When the memory controller 120 provides data read from the semiconductor memory device 200 to the host 100, and stores data from the host 100 into the semiconductor memory device 200 through the control of the read, write, program and erase operations of the semiconductor memory device 200 in response to the request of the host 100. Furthermore, the memory 190 may store data for the operation of the memory system 110 or the operation between the memory controller 120 and the semiconductor memory device 200.

The memory 190 may be formed of the volatile memory device such as DRAM or SRAM. The memory 190 may store data for the write and read operations between the memory controller 120 and the semiconductor memory device 200, and data during the write and read operations. To this end, the memory 190 may include a program memory, a data memory, a write buffer, a read buffer, a map buffer, and so forth.

Also, the memory 190 may store data for operations between the ECC unit 160 and the processor 140, such as data that is read during read operations. That is, the memory 190 may store data read from the semiconductor memory device 200. The data may include user data, parity data and status data. The status data may include information of which cycling group is applied to the memory block 210 of the semiconductor memory device 200 during the program operation.

The processor 140 may perform various control operations of the memory system 110. The processor 140 may control the write operation or the read operation to the semiconductor memory device 200 in response to the write request or the read request of the host 100. The processor 140 may drive firmware referred to as the flash translation layer (FTL) for general control of the memory system 110. The processor 140 may be formed of a microprocessor or a central processing unit (CPU).

Figure 3:
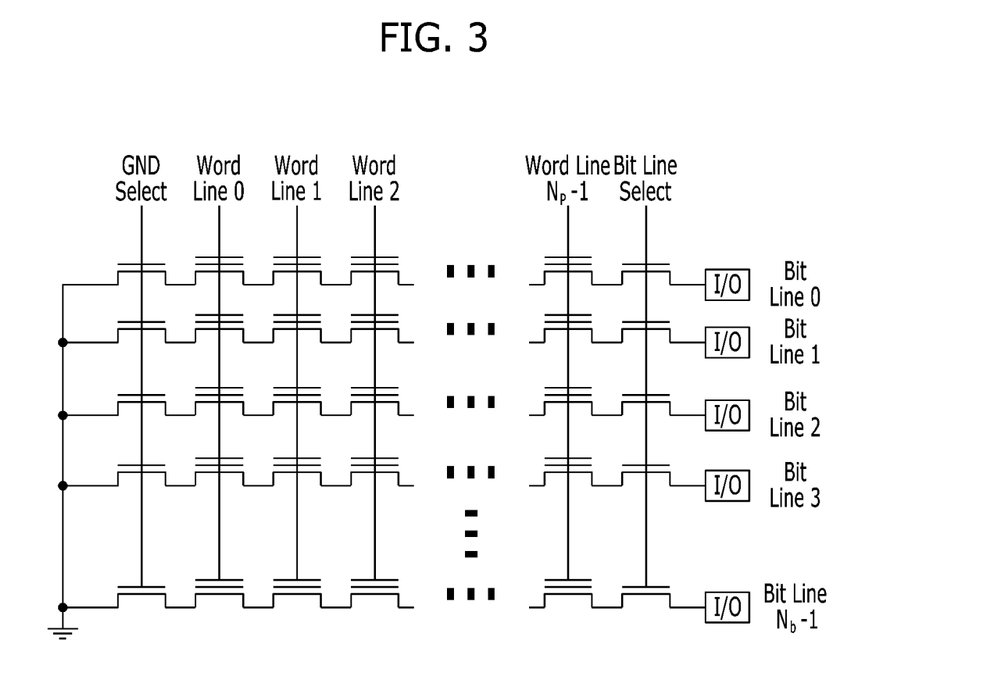
FIG. 3 is a diagram for describing a structure of a flash memory.

FIG. 3 is a diagram for describing a structure of a flash memory. Hereinafter, the structure of the flash memory device, unit of encoding/decoding of the error correction code, and an interference channel environment will be described with reference to FIG. 3.

Referring to FIG. 3, the error correction code of the flash memory may be programmed and read in units of a single page. A single block may include a plurality of word lines as well as bit lines. A single word line may be coupled to odd and even bit lines, and may have a plurality of pages with bits of a single cell. For example, in a multi-level cell for storing 2-bit information, a single word line may be coupled to the odd and even bit lines and may have 2 pages for the least significant bits (LSB) and the most significant bits (MSB) per a single bit line and a total of 4 pages for the odd and even bit lines. As described above, the error correction code of the flash memory device may correct errors of the cells in units of a single page.

Figure 4A:
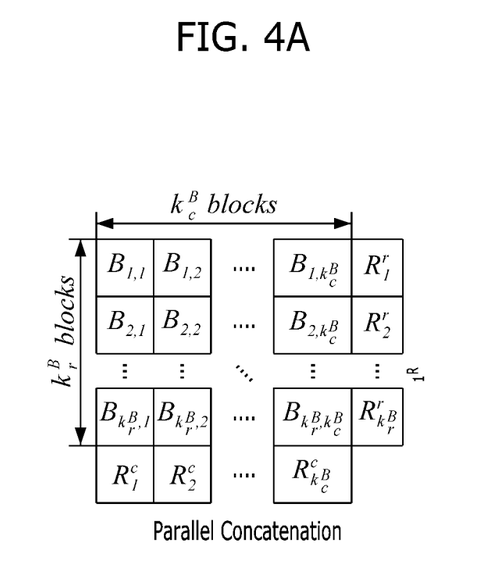
FIG. 4A is a diagram for describing a block-wise concatenated BCH code that is concatenated in parallel.
Figure 4B:
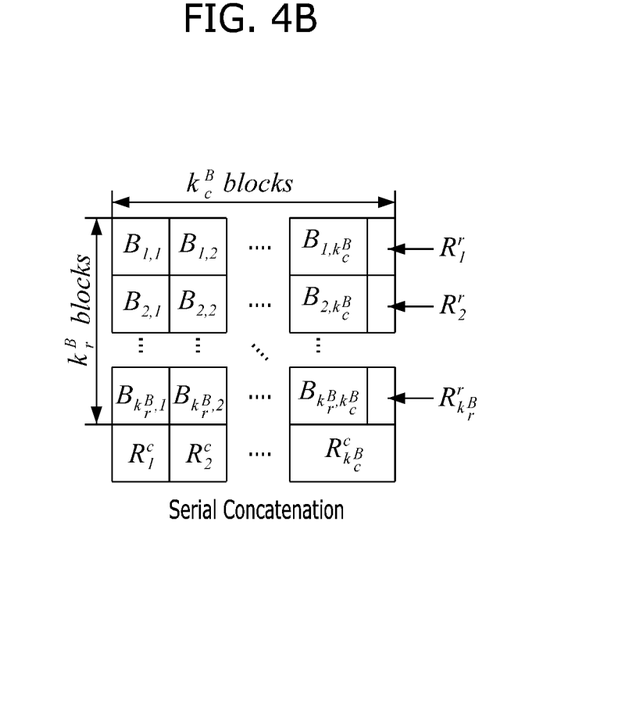
FIG. 4B is a diagram for describing a block-wise concatenated BCH code that is concatenated in series.

FIG. 4A is a diagram for describing a BC-BCH code that is concatenated in parallel (i.e., a parallel-concatenated BC-BCH code). FIG. 4B is a diagram for describing a BC-BCH code that is concatenated in series (i.e., a serial-concatenated BC-BCH code).

The block of the BC-BCH code is different from the memory block. The block of the BC-BCH code is a bundle of bits, which are sequentially arranged in line, although the block of the BC-BCH code is illustrated as a square in FIGS. 4A and 4B. The BC-BCH code may include a message block and a parity block, or may include a message-parity block in which the message block is combined with the parity block at the end thereof.

The BC-BCH code may include 2 kinds of the BCH constituent codes: a row BCH constituent code and a column BCH constituent code.

The row BCH constituent code may be the same as the column BCH constituent code in the parallel-concatenated BC-BCH code.

In the serial-concatenated BC-BCH code, the row BCH constituent code may serve as an outer code and the column BCH constituent code may serve as an inner code. A single row BCH constituent code may share a single block of BC-BCH code with a single column BCH constituent code. A single row BCH constituent code may share a single block with each of the column BCH constituent codes. A sing column BCH constituent code may share a single block with each of the row BCH constituent codes.

Both of the row BCH constituent code and the column BCH constituent code are BCH codes. The row BCH constituent code may correct $t_r$ bit-errors in $n_r$ bits having $k_r$ bits of a message to be protected and $m_r$ parity bits. The column BCH constituent code may correct $t_c$ bit-errors in $n_c$ bits having $k_c$ bits of a message to be protected and me parity bits. Hereinafter, it is assumed that the amount of data to be protected by the BC-BCH code is k, where k is a natural number.

Referring to FIG. 4A, the data may correspond to a message matrix the size of which is $k_r^B \times k_c^B$ of message blocks $B_{i,j}$. A single row BCH constituent code may include $k_c^B$ message blocks and one or more parity blocks. A single column BCH constituent code may include $k_r^B$ message blocks and one or more parity blocks.

For example, the BC-BCH code may include a plurality of message blocks, each of which is $n_B$ bits, as follows. Referring to FIG. 4A, an $i^{th}$ row BCH constituent code may include the message blocks of the $i^{th}$ row and the parity blocks of the $i^{th}$ row, as shown in Equation 1.

$$C'_i = [B_{i,1} \ldots B_{i,k_c^B} R_i^A] \quad \text{[Equation 1]}$$

Referring to FIG. 4A, $j^{th}$ column BCH constituent code may include the message blocks of the $j^{th}$ column and the parity blocks of the $j^{th}$ column, as shown in Equation 2.

$$C_j^c = [B_{i,j} \ldots B_{k_c^B} R_j^c] \quad \text{[Equation 2]}$$

The message length of the row BCH constituent code is shown in Equation 3.

$$k_r = k/k_r^B = n_B \times k_r^B \quad \text{[Equation 3]}$$

The code length of the row BCH constituent code is shown in Equation 4.

$$n_r = k_r + m_r \quad \text{[Equation 4]}$$

The message length of the column BCH constituent code is shown in Equation 5.

$$k_c = k/k_c^B = n_B \times k_r^B \quad \text{[Equation 5]}$$

The code length of the column BCH constituent code is shown in Equation 6.

$$n_c = k_c + m_c \quad \text{[Equation 6]}$$

The code rate of the BC-BCH code is shown in Equation 7.

$$R = \frac{k}{\left(k + m_r k_r^\beta + m_c k_c^\beta\right)} \quad \text{[Equation 7]}$$

In the above case, a single message block may include $n_B = k/(k_r^B \times k_c^B)$ bits, which is the same as the other message blocks.

When interleaving in order for each row BCH constituent code to have a different size of message block from the other of row BCH constituent code, while all the message blocks in a single row of BCH constituent code have the same size, the $i^{th}$ row BCH constituent code may include the message blocks of the $i^{th}$ row and the parity blocks of the $i^{th}$ row, as shown in Equation 1, and the $j^{th}$ column BCH constituent code may include the message blocks of the $j^{th}$ column and the parity blocks of the $j^{th}$ column, as shown in Equation 8.

$$C_j^C = [B_{1,f(j)} B_{2,f(j+1)} \ldots B_{k_r^B, f(i+k_r^B-1)} R_j^c], \text{ where } f(x) = \{(x-1) \bmod k_c^B\} + 1 \quad \text{[Equation 8]}$$

Referring to FIG. 4B, the data may be assigned to the message block, and the last block of each row BCH constituent code may be the parity block for the row BCH constituent code or the message-parity block for the row BCH constituent code. Except for the parity block for the column BCH constituent code, the message matrix may have the size of $k_r^B \times k_c^B$ of message blocks $B_{i,j}$ and include the message block, the message-parity block for the row BCH constituent code, and an extra parity block in each row. A single row BCH constituent code may include $k_c^B - 1$ message blocks and a single message-parity block. A single column BCH constituent code may include $k_r^B$ message blocks or the message-parity blocks and a single parity block. The serial-concatenated BC-BCH code may be designed so that the row BCH constituent code may correct more errors than the column BCH constituent code may correct ($t_r \leq t_c$).

For example, the serial-concatenated BC-BCH code may be designed so that each of the message blocks and the message-parity blocks may include $n_B$ bits as follows. Referring to FIG. 4B, $i^{th}$ row BCH constituent code may include the message blocks and the parity blocks of the $i^{th}$ row as shown in Equation 1.

Referring to FIG. 4B, $j^{th}$ column BCH constituent code may include the message blocks and the parity blocks of a $j^{th}$ column as shown in Equation 9 when $1 \leq j \leq k_c^B$.

$$C_j^c = [B_{i,j} \ldots B_{k_r^B} R_j^c] \quad \text{[Equation 9]}$$

The $j^{th}$ column BCH constituent code may include the message blocks and the parity blocks of $j^{th}$ column as shown in Equation 10, when $j = k_c^B$.

$$C_j^c = [\{B_{i,j}, R_i^r\} \ldots \{B_{k^B,j} R_k^r\} R_j^c] \quad \text{[Equation 10]}$$

The length of the message of the row BCH constituent code may be represented as shown in Equation 11.

$$k_r = k/k_r^B \quad \text{[Equation 11]}$$

The length of the code of the row BCH constituent code may be represented as shown in Equation 12.

$$n_r = k_r + m_r = n_B \times k_c^B \quad \text{[Equation 12]}$$

The length of the message of the column BCH constituent code may be represented as shown in Equation 13.

$$k_c = n_B \times k_r^B \quad \text{[Equation 13]}$$

The length of the code of the column BCH constituent code may be represented as shown in Equation 6.

The code rate of the serial-concatenated BC-BCH code may be represented in Equation 7.

In the serial-concatenated BC-BCH code, each of the message blocks and the message-parity blocks has the same number of bits, which is represented as $n_B = (k + m_r \times k_r^B)/(k_r^B \times k_c^B) = n_r/k_c^B$.

When interleaving in order for each row BCH constituent code to have a different size of message block from the other row BCH constituent code, while all the message blocks in a single row BCH constituent code have the same size, the row BCH constituent code and the column BCH constituent code may be represented similarly to the above-described Equations 1 and 8, respectively.

For convenience, the parallel-concatenated BC-BCH code will be described hereinafter. However, the description will be applied to the serial-concatenated BC-BCH code.

Figure 5:
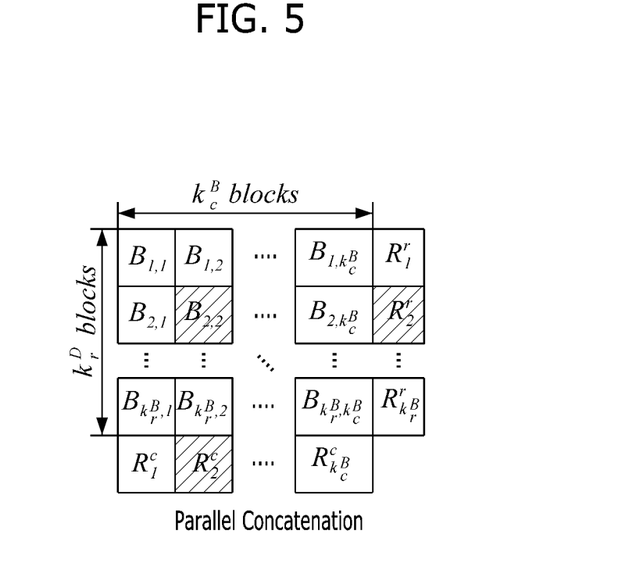
FIG. 5 is a diagram for describing a block-wise concatenated BCH code that is concatenated in parallel in accordance with an embodiment of the present invention.

FIG. 5 is a diagram for describing the parallel-concatenated BC-BCH code in accordance with an embodiment of the present invention. FIG. 5 shows a case in which a failure occurs in hard decision decoding.

The decoding according to the BC-BCH code is an iterative decoding by which the row BCH constituent code and the column BCH constituent code are alternately decoded. When such iterative decoding fails, new information from an iterative hard decision that is very similar to the result from the soft decision may be transferred to the decoder and the decoder may perform the chase decoding. The new information transferred to the decoder may be limited to decoding-failed parity blocks like the failed message block.

FIG. 5 shows the failed BC-BCH code due to a decoding fail of a pair of BCH constituent codes. FIG. 5 shows a decoding failure of the $2^{nd}$ row BCH constituent code and $2^{nd}$ column BCH constituent code after iterations of the hard decision decoding.

The decoding error rate of the BC-BCH code is very low because the error correction capability of the BCH constituent code of the BC-BCH code is greater than the product code. Therefore, when the BCH constituent code of the BC-BCH code succeeds in decoding, all of the errors are corrected. When the decoding fails due to an error message block, since the BC-BCH code includes blocks, the decoding may be retried by reading again the message block having the error. However, as described above, re-reading the page that has been read requires higher complexity and decoding delay time. Therefore, it is important to improve the performance through the result of the hard decision decoding without re-reading the message block.

Figure 6:
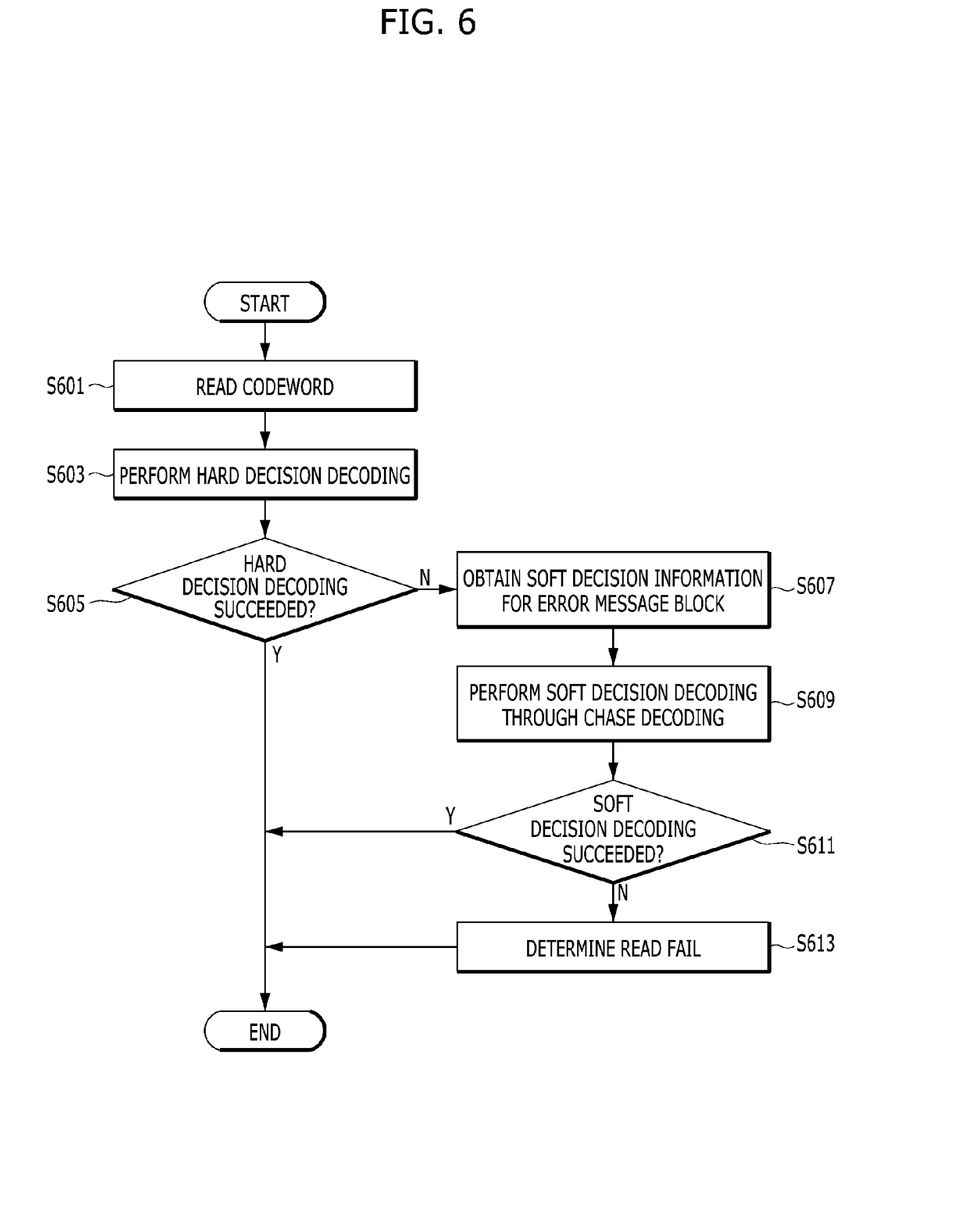
FIG. 6 is a flow chart for describing an operation method of a flash memory system in accordance with an embodiment of the present invention.

FIG. 6 is a flow chart for describing an operation method of the flash memory system in accordance with an embodiment of the present invention.

Referring to FIG. 6, at step S601, the memory controller 120 may read codewords from the memory block of the memory device 210 through a read voltage.

At step S603, the memory controller 120 may perform the hard decision decoding on the codeword read from the memory block for the error detection and the error correction. At step S505, the memory controller 120 may determine whether the hard decision decoding is successful. The hard decision decoding may be a block-wise concatenated Bose-Chadhuri-Hocquenghem (BC-BCH) code decoding. The data may be encoded in units of message blocks including a row constituent code and a column constituent code by the BC-BCH method. The hard decision decoding may be performed to the encoded data.

When the hard decision decoding is determined to be successful as a result of step S605, the memory controller 120 may transfer the codeword to which the hard decision decoding is determined to be successful to the host as data.

However, the hard decision decoding may not correct the error.

When the hard decision decoding is determined to fail as the result of step S605, the memory controller 120 may identify an error message block from the failure result of the hard decision decoding, and then may obtain soft decision information for the error message block at step S607. That is, the memory controller 120 may obtain the location and the number of the error blocks from the failed result of each of the row and column BCH constituent codes included in the BC-BCH code. Firstly, the memory controller 120 may identify the error message block to which the hard decision decoding fails. That is, the memory controller 120 may identify the error message block by receiving information about the failed row BCH constituent codes and column BCH constituent codes included in the BC-BCH code. Also, the memory controller 120 may obtain the soft decision information for the error message block. That is, the memory controller 120 may obtain the soft decision information by using the threshold voltage for the error message block.

At step S609, the memory controller 120 may perform the soft decision decoding according to the soft decision information obtained at step S607. At step S611, the memory controller 120 may determine whether the soft decision decoding is successful. The soft decision decoding may be performed through the block turbo code. The soft decision decoding of the block turbo code may be performed based on the chase decoding. The soft decision decoding will be described with reference to FIGS. 7 to 9.

Figure 7:
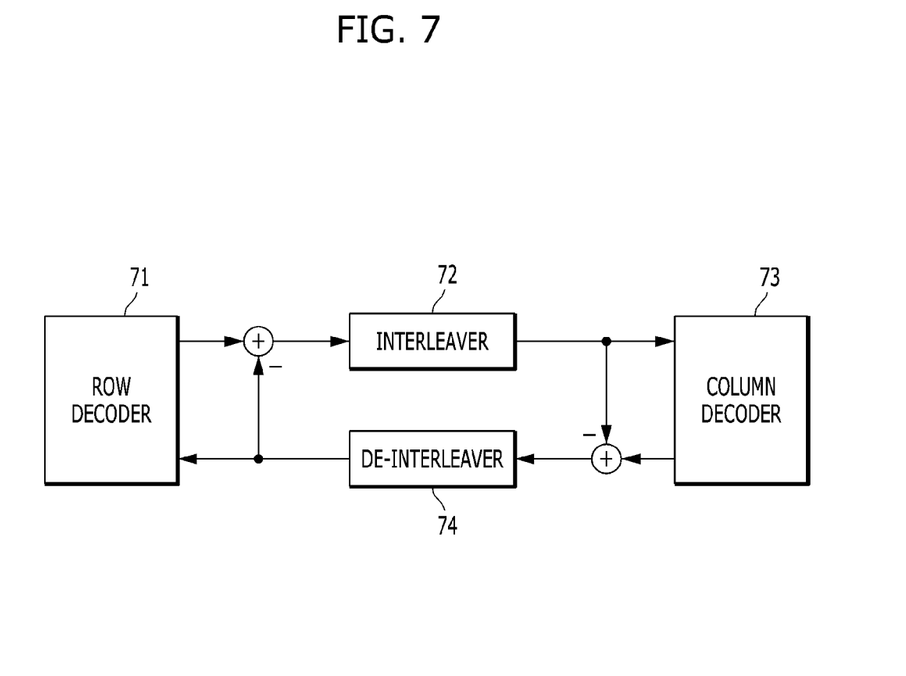
FIG. 7 is a block diagram illustrating a decoding circuit using a BC-BCH code for a flash memory system in accordance with an embodiment of the present invention.

FIG. 7 is a block diagram illustrating a decoding circuit using the BC-BCH code for the flash memory system in accordance with an embodiment of the present invention. The decoding circuit may include a $1^{st}$ stage decoder, an interleaver, a $2^{nd}$ stage decoder, and a de-interleaver.

Referring to FIG. 7, the $1^{st}$ stage decoder may include a row code decoder 71, the interleaver may include a block-wise interleaver 72, the $2^{nd}$ stage decoder may include a column code decoder 73, and the de-interleaver may include a block-wise de-interleaver 74.

The decoding circuit using the BC-BCH code may alternately perform the row decoding and the column decoding iteratively. The decoding may end according to a maximum iteration number or an iteration end condition. That is, the iteration may end when decoding performed on all of previously decoding-failed row and column BCH constituent codes repeatedly fails during current iteration. This iteration end condition represents the situation where the error is not corrected despite of the iterative decoding.

The row code decoder 71 may receive $1^{st}$ soft decision information corresponding to the error message block without extrinsic information, generate $1^{st}$ extrinsic information through a decoding operation, and output the $1^{st}$ extrinsic information to the column code decoder 73. In order for the column code decoder 73 to receive the $1^{st}$ extrinsic information, the block-wise interleaver 72 should perform an operation. Therefore, the column code decoder 73 may receive the $1^{st}$ extrinsic information and $2^{nd}$ soft decision information from the block-wise interleaver 72 and perform a decoding operation.

$2^{nd}$ extrinsic information generated by the decoding operation of the column code decoder 73 may be outputted to the row code decoder 71. A de-interleaving operation of the block-wise de-interleaver 74 may arrange a sequence of information. Therefore, the row code decoder 71 may additionally perform decoding operations through the de-interleaved $2^{nd}$ extrinsic information. This process may be iterated and the turbo decoder may determine decoding values of the received signal.

The operation of the row code decoder 71 and the column code decoder 73 will be described with reference to FIG. 8.

Figure 8:
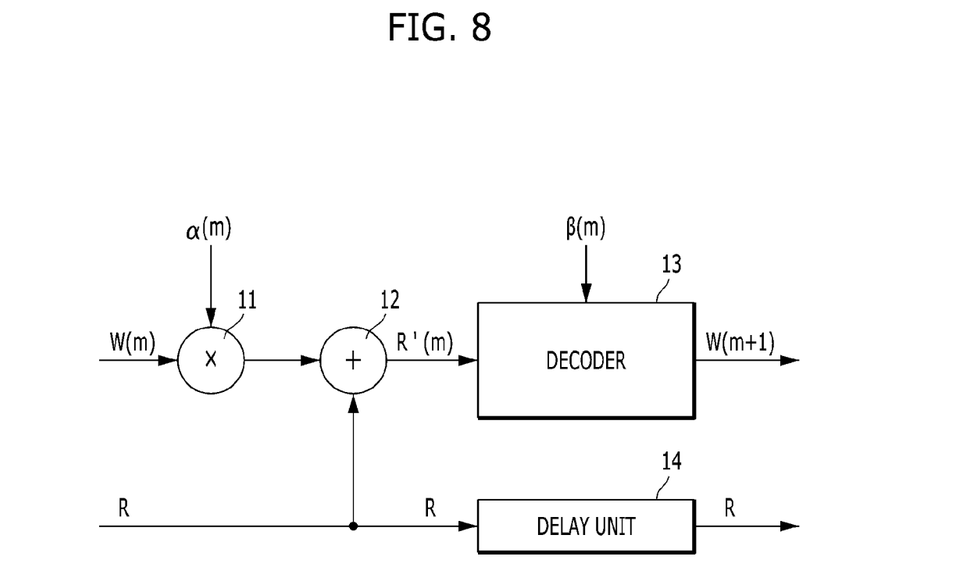
FIG. 8 is a block diagram illustrating a decoding apparatus using a BC-BCH code in accordance with an embodiment of the present invention.

FIG. 8 a block diagram illustrating a decoding apparatus using the BC-BCH code in accordance with an embodiment of the present invention.

Referring to FIG. 8, the decoding apparatus may include a multiplier 11, an adder 12, a decoder 13, and a delay unit 14. The multiplier 11 may receive extrinsic information W(m) and a 1$^{st}$ scaling value α(m), may perform multiplication to the extrinsic information W(m) and the 1$^{st}$ scaling value α(m), and may output a result of the multiplication to the adder 12. The adder 12 may generate an added output R'(m) by adding the soft decision information R to the output of the multiplier 11, and output the added output R'(m) to the decoder 13. The soft decision information R may be delayed by a predetermined amount of time by the delay unit 14 while being inputted to the multiplier 11.

The decoder 13 may receive the output value R'(m) from the adder 12 and a 2$^{nd}$ scaling value β(m), and may output the extrinsic information W(m+1).

The 1$^{st}$ and 2$^{nd}$ scaling values α(m) and β(m) may be provided to reduce effects caused by the variance of the extrinsic information of the previous decoding, and may have values of 0≤α and β≤1.

The variance of the extrinsic information W(m+1) that is the output of the decoder 13 may have a great value at a 1$^{st}$ decoding and may have smaller value as the decoding iterates. The 1$^{st}$ and 2$^{nd}$ scaling values α(m) and β(m) may be provided to reduce effects of the extrinsic information at earlier decoding stages where reliability of the extrinsic information is low. That is, the 1$^{st}$ and 2$^{nd}$ scaling values α(m) and β(m) may be small at the earlier iteration stage and may become greater because the reliability of the extrinsic information becomes greater as the decoding iterates.

Figure 9:
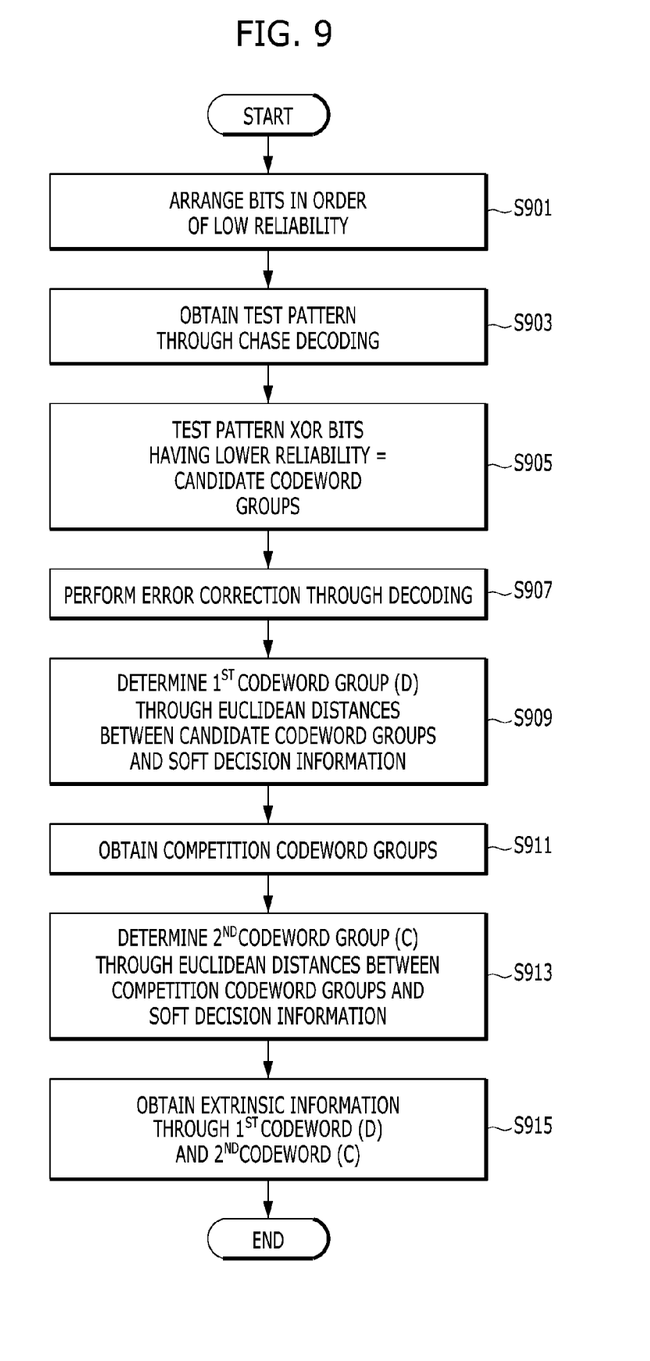
FIG. 9 is a flow chart for describing a turbo decoding method in accordance with an embodiment of the present invention.

FIG. 9 is a flow chart for describing a turbo decoding method in accordance with an embodiment of the present invention. FIG. 9 shows the error correction operation through the turbo decoding method and the generation of the extrinsic information illustrated in FIGS. 7 and 8.

Referring to FIG. 9, at step S901, the decoder 13 may arrange the added output R'(m), which is outputted from the adder 12 and is the absolute value of the sum of the soft decision information R and the output value of the multiplier 11, in ascending order. The added output R'(m) may include bits b$_n$ having high reliability. Therefore, the decoder 13 may arrange the bits b$_n$ having high reliability in ascending order.

At step S903, based on the chase decoding, 'np' bits having lower reliability may be selected among the bits b$_n$ having the reliability and arranged in ascending order, the selected np bits having lower reliability are flipped by the 2$^{np}$ cases, and 2$^{np}$ test patterns may be obtained. The np bits having lower reliability may be represented by Equation 14.

$$np = \left| \frac{d_{min}}{2} \right|$$ [Equation 14]

The d$_{min}$ represents the hamming distance between the BCH constituent codes.

At step S905, 2$^{np}$ codewords of the candidate codeword group may be generated through the exclusive OR (XOR) operation between each of the 2$^{np}$ test patterns and the np bits having lower reliability.

At step S907, errors may be corrected through the decoding.

At step S909, the Euclidean distances between the 2$^{np}$ codewords of the candidate codeword group obtained at step S905 and the soft decision information R may be calculated and a 1$^{st}$ codeword D with the shortest Euclidean distance may be determined among the Euclidean distances between the 2$^{np}$ codewords of the candidate codeword group and the soft decision information R.

At step S911, a competition codeword group may be obtained. The competition codeword group may include one or more codewords among the 2$^{np}$ codewords of the candidate codeword group, an i$^{th}$ bit of which is different from i$^{th}$ bit of the 1$^{st}$ codeword D. That is, when the extrinsic information of the i$^{th}$ bit included in the 2$^{np}$ codewords of the candidate codeword group is to be generated, the i$^{th}$ bit included in the 2$^{np}$ codewords of the candidate codeword group and the i$^{th}$ bit of the 1$^{st}$ codeword D may be compared and one or more codewords among the 2$^{np}$ codewords of the candidate codeword group, the i$^{th}$ bit of which is different from the i$^{th}$ bit of the 1$^{st}$ codeword D, may be obtained as the competition codeword group.

At step S913, the Euclidean distances between the codewords of the competition codeword group obtained at step S911 and the soft decision information R may be calculated and a 2$^{nd}$ codeword C that had the shortest Euclidean distance may be determined among the Euclidean distances between the codewords of the competition codeword group and the soft decision information R.

At step S915, the extrinsic information Wi may be obtained through the 1$^{st}$ codeword D, the 2$^{nd}$ codeword C, and Equation 15.

$$Wi = \frac{[R-C]^2 - [R-D]^2}{4}$$ [Equation 15]

R of Equation 15 represents the soft decision information for the row BCH constituent code or the column BCH constituent code of the error message block.

When the 2$^{nd}$ codeword C does not exist, experimental values according to the number of the iterative decoding may be obtained as the extrinsic information Wi.

The decoder 13 may perform additional decoding operations by inputting the obtained extrinsic information Wi to the row code decoder 71 or the column code decoder 73. After such operation iterates a predetermined number times, the turbo decoder may determine the decoded value for the received signal.

Referring back to FIG. 6, when the soft decision decoding is determined to be successful as a result of step S611, the memory controller 120 may transfer the codeword to which the soft decision decoding is determined to be successful to the host as data.

When the soft decision decoding is determined to fail as the result of step S611, the read operation from the memory block 210 may be finally determined to fall and the memory controller 120 may output an error decoding failure signal to the host at step S613.

Figure 10:
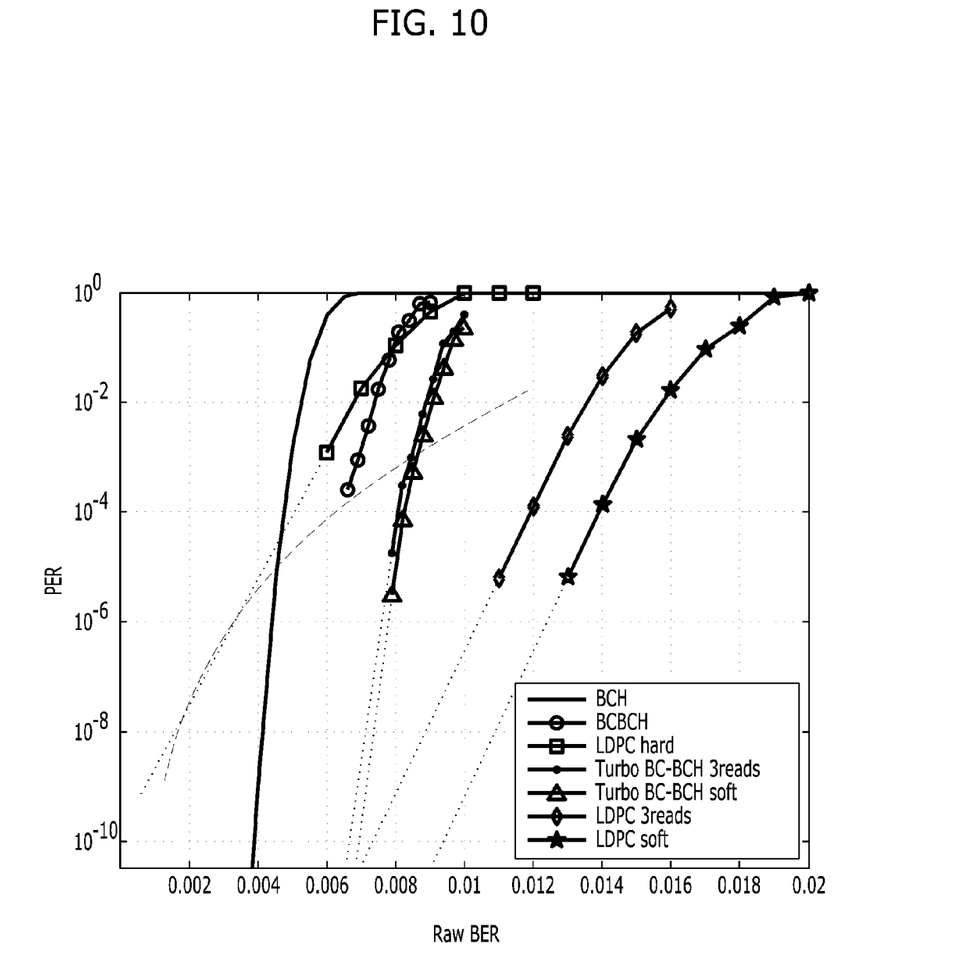
FIG. 10 is a graph illustrating a simulation result of performances of LDPC code and a BC-BCH code in accordance with an embodiment of the present invention.

FIG. 10 is a graph illustrating a simulation result of performances of LDPC code and the BC-BCH code in accordance with an embodiment of the present invention.

Referring to FIG. 10, the BCH code for the simulation is designed as (36328, 32768), which has 0.895 of the coding rate and has 4 KB message. FIG. 10 shows the performance of the hard decision decoding.

Legends of "BC-BCH", "Turbo BC-BCH 3reads", and "Turbo BC-BCH soft" represents the performances of the BC-BCH codes utilizing the hard decision decoding, three readings of the reference voltage, and the soft decision decoding, respectively. The BC-BCH code includes 38 row BCH constituent code and 38 column BCH constituent code, and has (913, 863) of parameters. Each code has 5 of the error correction capacity.

The LDPC code is designed to have 0.892 of the coding rate according to the array LDPC method. Considering the decoder complexity, it is assumed that the LDPC code has a 1 KB message. That is, FIG. 10 shows the performance of the LDPC code when the 4 KB messages are protected by 4 LDPC codes. Legends of "LDPC hard", "LDPC 3reads", and "LDPC soft" represents the decoding results of decoding the LDPC codes through a Log sum-product algorithm utilizing the hard decision decoding, the readings of the reference voltage, and the soft decision decoding, respectively.

Referring to FIG. 10, the performance of the hard decision decoding of the BC-BCH code is superior to the LDPC code, and the performance of three readings of the BC-BCH code is similar to the LDPC code.

While the present invention has been described with respect to the specific embodiments, it will be apparent to those skilled in the art that various changes and modifications may be made without departing from the spirit and scope of the invention as defined in the following claims.

What is claimed is:

1. An operation method of a flash memory system having a controller and a memory device, the operation method comprising:
   performing hard decision decoding on a codeword, which comprises message blocks encoded with row constituent codes and column constituent codes according to a block-wise concatenated BCH (BC-BCH) method;
   identifying an error message block to which the hard decision decoding fails among a plurality of the message blocks, when the hard decision decoding fails;
   generating soft decision information corresponding to the row constituent codes and the column constituent codes of the error message block; and
   performing soft decision decoding on the error message block based on the soft decision information,
   wherein the performing of the soft decision decoding comprises:
      generating second extrinsic information by decoding the soft decision information and first extrinsic information corresponding to the row constituent codes of the error message block; and
      generating third extrinsic information by decoding the soft decision information corresponding to the column constituent codes and the second extrinsic information.

2. The operation method of claim 1, wherein the soft decision decoding includes a turbo BC-BCH code.

3. The operation method of claim 1, wherein the soft decision information is generated using a reference voltage for the error message block.

4. The operation method of claim 1, wherein the first extrinsic information includes initial extrinsic information and a default value.

5. The operation method of claim 1, wherein the generating of the second extrinsic information comprises:
   arranging a plurality of bits, which are obtained through a sum of the soft decision information corresponding to the row constituent code of the error message block and the first extrinsic information, in ascending order;
   obtaining a test pattern by selecting a predetermined number of bits having lower reliability among the plurality of the bits in ascending order of reliability of the plurality of the bits;
   obtaining candidate codewords by performing an XOR operation on the test pattern and the bits having lower reliability;
   determining a first codeword using the candidate codewords and the soft decision information;
   obtaining competition codewords, which do not correspond to the first codeword among the candidate codewords;
   determining a second codeword using the competition codewords and the soft decision information; and
   generating the second extrinsic information through the first codeword and the second codeword.

6. The operation method of claim 5, wherein the test pattern is obtained by selecting bits having lower reliability in ascending order of reliability of the plurality of the bits and performing chase decoding.

7. The operation method of claim 5, wherein, in the determining of the first codeword, Euclidean distances are obtained using the candidate codewords and the soft decision information and the smallest one of the Euclidean distances is selected.

8. The operation method of claim 5, wherein, in the determining of the second codeword, Euclidean distances are obtained using the competition codewords and the soft decision information and the smallest one of the Euclidean distances is selected.

9. The operation method of claim 5, wherein, in the generating of the second extrinsic information, the second extrinsic information is generated using Equation 1:

$$Wi = \frac{|R-C|^2 - |R-D|^2}{4} \quad \text{[Equation 1]}$$

wherein 'Wi' represents the second extrinsic information, 'R' represents the soft decision information for the row constituent codes of the error message block, 'C' represents the second codeword, and 'D' represents the first codeword.

10. The operation method of claim 1, wherein the generating of the third extrinsic information comprises:
   arranging a plurality of bits, which are obtained through a sum of the soft decision information corresponding to the column constituent code of the error message block and the second extrinsic information, in ascending order;
   obtaining a test pattern by selecting a predetermined number of bits having lower reliability among the plurality of the bits in ascending order of reliability of the plurality of the bits;
   obtaining candidate codewords by performing an XOR operation on the test pattern and the bits having lower reliability;
   determining a first codeword using the candidate codewords and the soft decision information;
   obtaining competition codewords, which do not correspond to the first codeword among the candidate codewords;
   determining a second codeword using the competition codeword and the soft decision information; and
   obtaining the third extrinsic information through the first codeword and the second codeword.

11. The operation method of claim 10, wherein the test pattern is obtained by selecting bits having lower reliability in ascending order of reliability of the plurality of the bits and performing chase decoding.

12. The operation method of claim 10, wherein, in the determining of the first codeword, Euclidean distances are obtained using the candidate codewords and the soft decision information and the smallest one of the Euclidean distances is selected.

13. The operation method of claim 10, wherein, in the determining of the second codeword, Euclidean distances are obtained using the competition codewords and the soft decision information and the smallest one of the Euclidean distances is selected.

14. The operation method of claim 10, wherein, in the obtaining of the third extrinsic information, the third extrinsic information is obtained using Equation 2:

$$Wi = \frac{|R-C|^2 - |R-D|^2}{4} \quad \text{[Equation 2]}$$

wherein 'Wi' represents the third extrinsic information, 'R' represents the soft decision information for the column constituent codes of the error message block, 'C' represents the second codeword, and 'D' represents the first codeword.

15. A flash memory system comprising:
a controller; and
a memory device,
wherein the controller is configured to:
perform hard decision decoding on a codeword, which comprises message blocks encoded with row constituent codes and column constituent codes according to a block-wise concatenated BCH (BC-BCH) method;
identify an error message block on which the hard decision decoding fails;
generate soft decision information corresponding to the row constituent codes and the column constituent codes of the error message block; and
perform soft decision decoding on the error message block based on the soft decision information,
wherein the controller is further configured to:
generate second extrinsic information by decoding the soft decision information and first extrinsic information corresponding to the row constituent codes of the error message block; and
generate third extrinsic information by decoding the soft decision information corresponding to the column constituent codes and the second extrinsic information.

16. The flash memory system of claim 15, wherein the soft decision decoding includes a turbo BC-BCH code.

17. The flash memory system of claim 15, wherein the controller is further configured to:
arrange a plurality of bits, which are obtained through a sum of the soft decision information corresponding to the row constituent code of the error message block and the first extrinsic information, in ascending order;
obtain a test pattern by selecting a predetermined number of bits having lower reliability among the plurality of the bits in ascending order of reliability of the plurality of the bits;
obtain candidate codewords by performing an XOR operation on the test pattern and the bits having lower reliability;
determine a first codeword using the candidate codewords and the soft decision information;
obtain competition codewords that do not correspond to the first codeword among the candidate codewords;
determine a second codeword using the competition codewords and the soft decision information; and
generate the second extrinsic information through the first codeword and the second codeword.

18. The flash memory system of claim 15, wherein the controller is further configured to:
arrange a plurality of bits, which are obtained through a sum of the soft decision information corresponding to the column constituent code of the error message block and the second extrinsic information, in ascending order;
obtain a test pattern by selecting a predetermined number of bits having lower reliability among the plurality of the bits in ascending order of reliability of the plurality of the bits;
obtain candidate codewords by performing an XOR operation on the test pattern and the bits having lower reliability;
determine a first codeword using the candidate codewords and the soft decision information;
obtain competition codewords that do not correspond to the first codeword;
determine a second codeword using the competition codewords and the soft decision information; and
generate the third extrinsic information through the first codeword and the second codeword.

* * * * *